United States Patent [19]
Kos et al.

[11] Patent Number: 5,248,033
[45] Date of Patent: Sep. 28, 1993

[54] HINGED TILT BOX WITH INCLINED PORTION

[75] Inventors: Robert D. Kos, Victoria; Tracy J. Niebeling, Minneapolis; Shawn D. Eggum, Chaska, all of

[73] Assignee: Fluoroware, Inc., Chaska, Minn.

[21] Appl. No.: 699,747

[22] Filed: May 14, 1991

[51] Int. Cl.⁵ .................................. B65D 85/30
[52] U.S. Cl. ........................ 206/334; 206/454; 211/41; 220/338
[58] Field of Search .......... 206/334, 453, 454, 328; 211/41; 118/500; 220/337, 338

[56] References Cited

U.S. PATENT DOCUMENTS

| | | | |
|---|---|---|---|
| 3,055,534 | 9/1962 | Boenecke | 220/338 |
| 3,086,676 | 4/1963 | Dilatush | 220/338 |
| 3,333,726 | 8/1967 | Belanger | 220/337 |
| 4,450,960 | 5/1984 | Johnson | 206/334 |
| 4,520,925 | 6/1985 | Johnson | 206/334 |
| 4,609,103 | 9/1986 | Bimer et al. | |
| 4,663,803 | 5/1987 | Gora | 220/337 X |
| 4,718,549 | 1/1988 | Rissotti et al. | 206/334 |
| 4,809,874 | 3/1989 | Pehr | 220/338 |
| 4,949,848 | 8/1990 | Kos | |
| 5,111,936 | 5/1992 | Kos | 206/334 |

OTHER PUBLICATIONS

Exhibit A-Prior Art Attached.
Exhibit B-Prior Art Attached.
Exhibit C-Prior Art Attached.

*Primary Examiner*—Bryon P. Gehman
*Attorney, Agent, or Firm*—Palmatier, Sjoquist & Helget

[57] ABSTRACT

A container for storing and transporting a wafer carrier filled with wafers and comprising a box with an openable lid, the box bottom having an inclined bottom panel portion and an inclined sidewall panel portion, supporting the bottom of the carrier and the H-bar end wall.

16 Claims, 6 Drawing Sheets

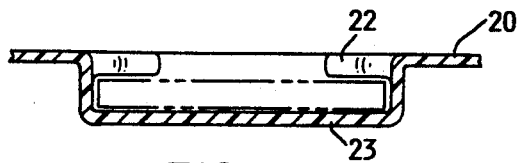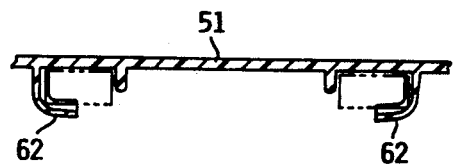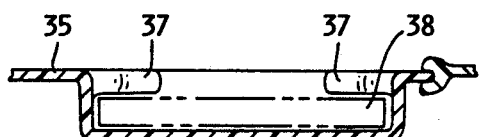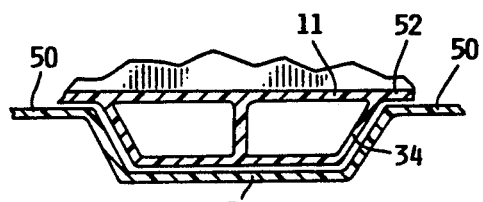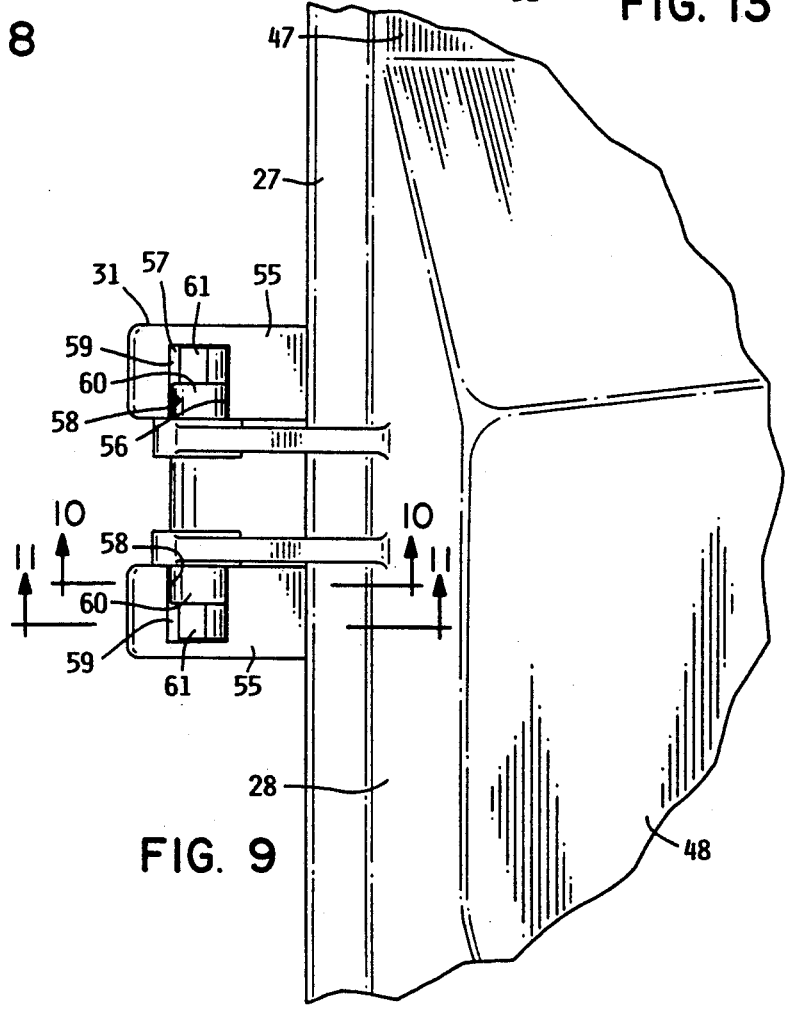

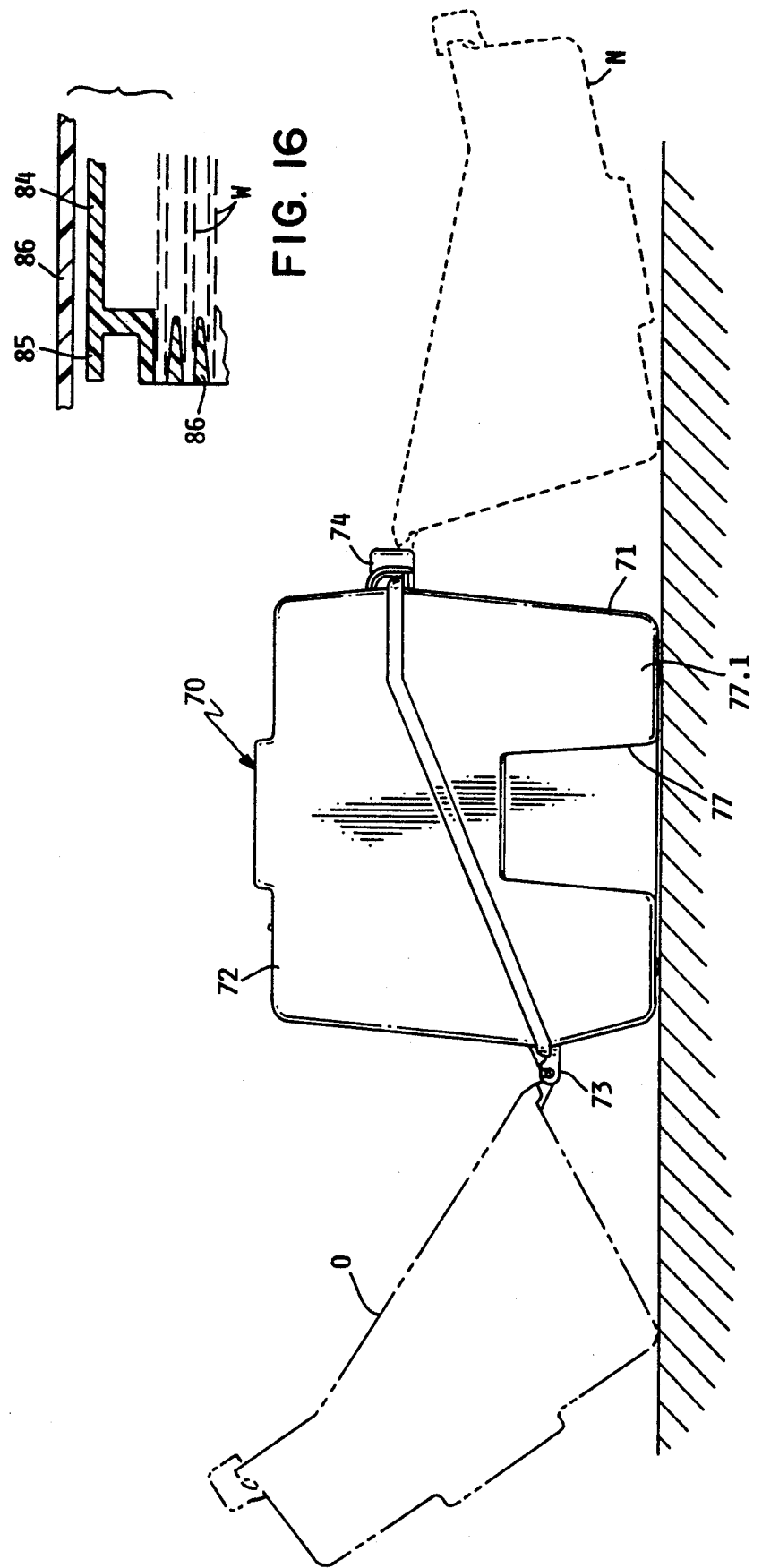

HINGED TILT BOX WITH INCLINED PORTION

BACKGROUND OF THE INVENTION

This invention relates to containers or storage boxes for storing and transporting wafer carriers, which are filled with silicon wafers.

There have been certain wafer boxes in the past for confining wafer carriers for silicon wafers, but such boxes had significant disadvantages. For instance, the wafer carriers have not been securely confined within the box and the wafers in the carriers have been permitted to move around as the box is lifted and moved and jostled slightly. Prior boxes have not been well adapted to handling the wafer carriers by means of robots, and interchangeably handling the wafer carriers manually when the boxes have been opened.

SUMMARY OF THE INVENTION

An object of the invention is to provide a new and improved closed storage box for storing and transporting wafer carriers or similar cassettes filled with wafers of silicon or other similar material, memory disks, photoplates and the like, and adapted to be handled by robots or manually.

A feature of the invention is the provision of a molded plastic box with a swingable cover readily detachable from the box bottom. The box bottom also has a combination of features contributing to ease of insertion and removal of the disk carrier and to the proper locating of the carrier and wafers in a predetermined position, tilted at a steep angle so that the usable or "green" side of the disks do not touch any portions of the carrier. Within such a combination of features are a preformed tilted support wall against which only the H-bar end of the carrier may rest; a tilted foot wall against which the feet of the carrier lie and engage locator deformations in the foot wall; significant height differentials between the rear hinge portion and the front latch portion of the box bottom; and tilted portions of the cover to uniformly confront the edges of the disks contained in the carrier.

The tilted support wall requires the H-bar end of the carrier to rest against the support wall, and as this occurs, the carrier is correctly positioned in the proper location for robotic or manual removal and for maintaining the disks lying with only their blank surfaces bearing against the spacer ribs or teeth of the carrier.

The tilted foot wall also supports the carrier by engaging the carrier's feet; and offset or ledge portions of the foot wall bear transversely against the elongated feet to properly locate the carrier on the foot wall and assure engagement by the H-bar end with the preformed portions of the tilted support wall.

As between the opposite hinge portions and latch portions of the box bottom at which the cover engages, the various substantial height differentials and the absence of obstructions in the box bottom to movement of the carriers as they are being removed, also contribute materially to the ease of robotic or manual handling of the carriers as they are being either inserted into or removed from the box. All of these combined features constitute materially to the proper positioning of the disks in tilted position as they are stored and transported, and as to minimize any movement of the disks on the spacer ribs or teeth within the carrier, thus minimizing any possibility of damage to the wafers and particularly to the very sensitive front surfaces of the wafers which are being processed.

BRIEF DESCRIPTION OF THE DRAWINGS

FIG. 6 is an enlarged detail section view taken approximately at 6—6 in FIG. 4.

FIG. 7 is an enlarged detail section view taken approximately at 7—7 in FIG. 4.

FIG. 8 is a detail section view taken approximately at 8—8 in FIG. 1.

FIG. 9 is an enlarged detail plan view of one of the hinge assemblies.

FIG. 13 is an enlarged detail section view taken approximately at 13—13 in FIG. 4.

FIG. 14 is a side elevation view of an alternate form of the invention illustrating alternate open arrangements of the cover.

FIG. 16 is an enlarged detail section view taken approximately at 16—16 in FIG. 15.

DETAILED SPECIFICATION

Figure 1:
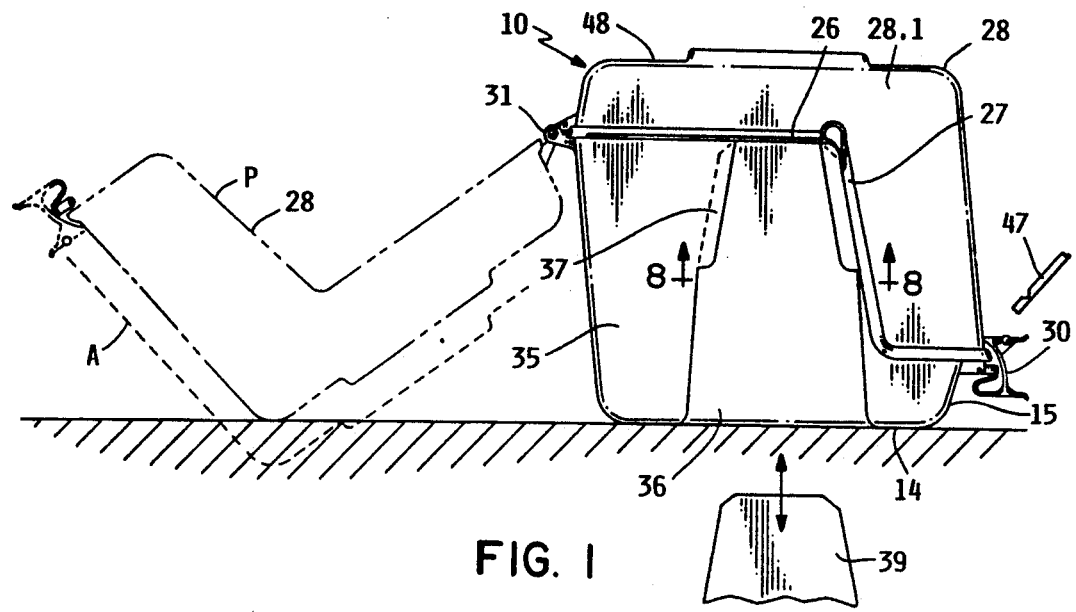
FIG. 1 is a side elevation view of the invention and showing an open position of the cover in phantom lines.

The wafer carrier shipping and storage container illustrated in FIGS. 1-13 is indicated in general by numeral 10 and is entirely molded of plastic such as carbon filled polycarbonate as to absorb any jostling that may occur in transport and as to protect the wafer carrier 11 contained therein against damage and to protect the wafers W carried in the carrier 11. The wafer carrier is illustrated by the dotted outline in FIGS. 3 and 4, and portions of such a carrier are also illustrated in FIGS. 5 and 13. The wafer carrier may be of any of a number of types of carriers, but such a carrier is illustrated in U.S. Pat. No. 4,949,848. Other wafer carriers of the same general type may also be used with the container 10 described herein. As illustrated in FIG. 5, such a wafer carrier may have individual compartments 12 for separating the wafers W from each other. The wafer carrier 12 has a multiplicity of spacing ribs 13 separating the compartments from each other and maintaining the wafers W in spaced relation with each other.

Such wafers are usually made of silicon, but may be of gallium arsenide, and are in the range of 0.050 inches in thickness and 150 to 200 millimeters in diameter, or larger. As such wafers are being processed into circuits or circuit chips, the processing adds substantial value to the wafers and so any possibility of damage or breakage to the wafers is extremely serious and should be avoided. Memory disks and photoplates have generally the same proportions as silicon wafers, wherever herein, the word wafer is used, it is meant to include disks, plates, substrates and other similarly shaped articles.

Figure 4:
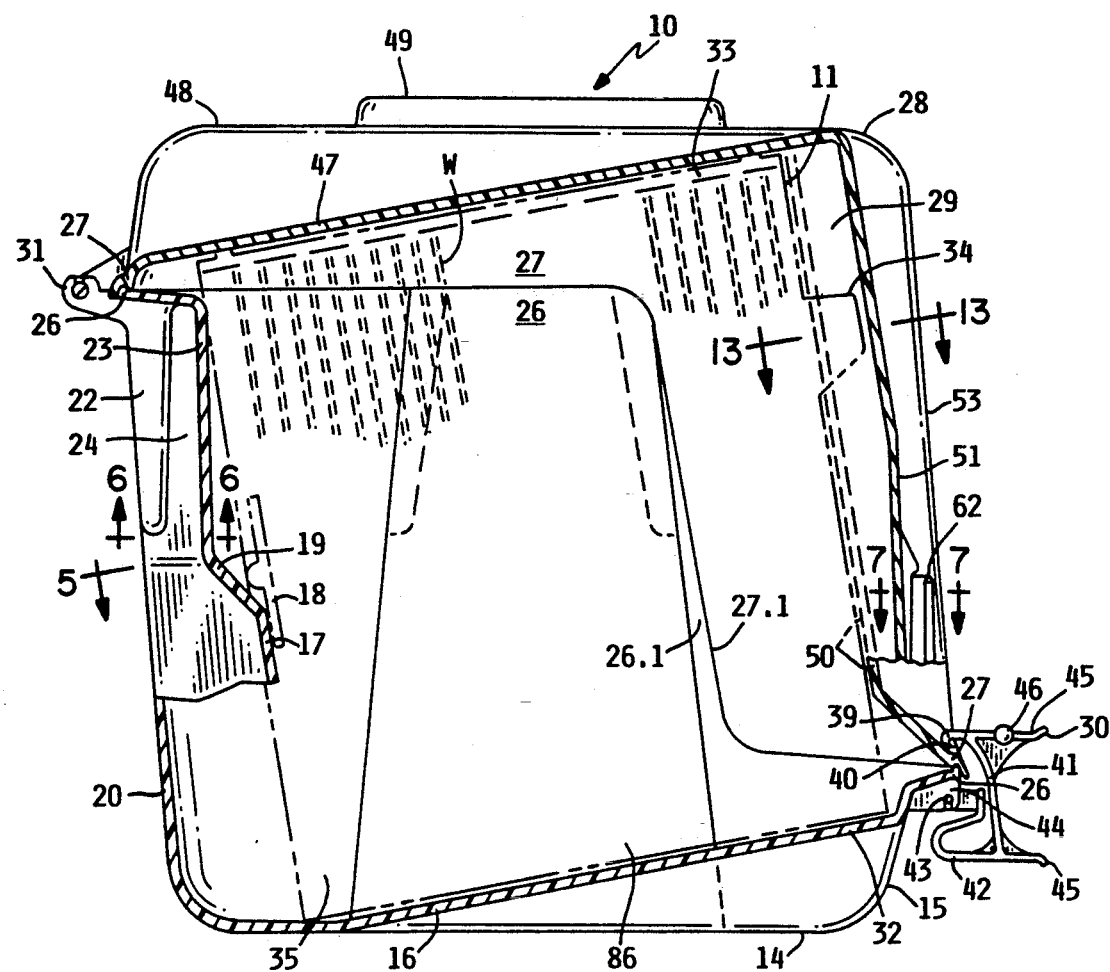
FIG. 4 is a section view taken on a broken line as indicated at 4—4 in FIGS. 2 and 3.
Figure 5:
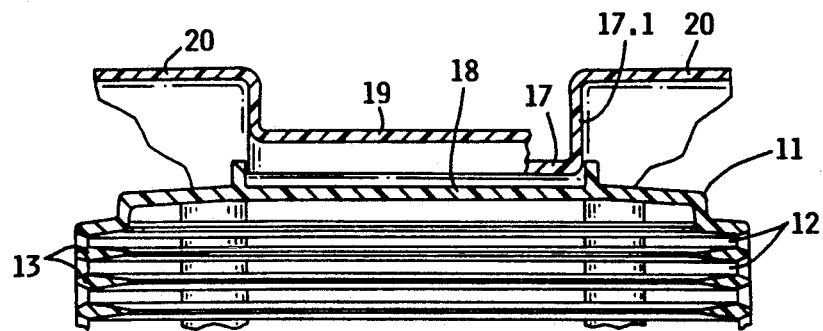
FIG. 5 is an enlarged detail section view taken approximately at 5—5 in FIG. 4.
Figure 10:
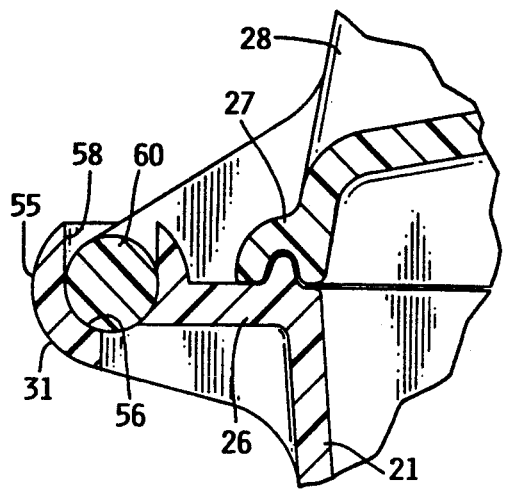
FIG. 10 is an enlarged detail section view taken approximately at 10—10 in FIG. 9.

As illustrated in FIG. 4, the wafer carrier 11 is supported in inclined position within the container 10 when the supporting portions 14 of the container rest upon a horizontal surface such as a shelf, and it will be recognized that the bottom portion 15 of the container has an inclined bottom panel portion 16 and an inclined sidewall panel portion 17, both of which serve to support the wafer carrier 11 in the inclined position. The bottom panel portion 16 supports the lower portion or feet 11.1 of the wafer carrier 11, and the inclined sidewall portion 17 supports the end wall portion 18 of the carrier which end wall portion 18 may be described as the H-bar end wall of the carrier. The bottom panel portion 16 is inclined at approximately 10° from the horizontal; and the generally upright sidewall panel portion 17 is oriented at approximately 10° from the vertical; and it will be appreciated that the two wafer carriers that support the panel portions 16 and 17 are oriented at approximately right angles with respect to each other. The inclined sidewall panel portion 17 of the bottom portion 15 has a recess portion 19 as to be uniquely shaped and configured to receive portions of the H-bar end wall 18 of the carrier. Similarly, the bottom panel portion 16 is offset at 16.1 to guide the feet 11.1 of the carrier into proper position within the bottom portion 15 of the box.

Figure 2:
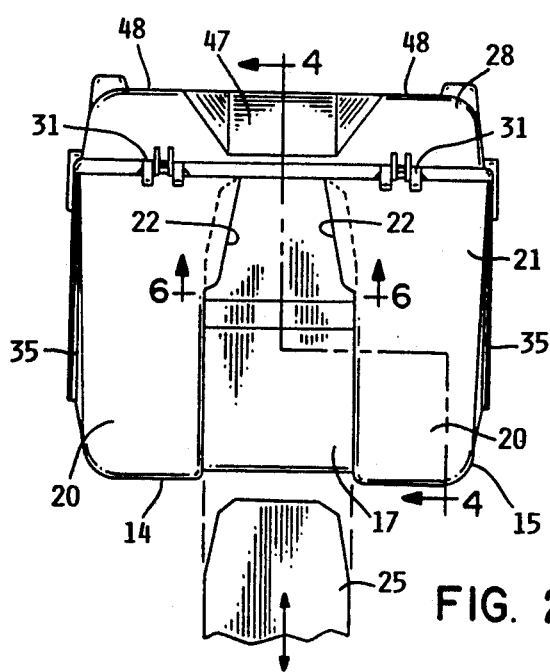
FIG. 2 is a rear elevation view thereof.

The inclined sidewall portion 17 of the bottom portion 15 of the box comprises only a portion of the width of the box, as illustrated in FIG. 2; and additional panel portions 20 cooperate with the panel portion 17 in defining the rear wall 21 of the bottom portion 15 of the box. The rear wall 21 of the box bottom portion 15 also defines a pair of flanges or elongate tabs 22 spaced from the upper portion 23 of the inclined sidewall panel portion 17 and defining recesses 24 to receive a portion of a robot arm 25 as illustrated in FIG. 2 for the purpose of lifting the box or tilting or maintaining the orientation of the box as a whole.

The bottom portion 15 of the box has a rim portion 26 which interfits closely with the rim portion 2 of the cover portion 28 of the box; and the interfitting rim portions 26 and 27 extend around the entire periphery of the box and fit closely together at all sides of the box so as to completely enclose the interior 29 of the box when the cover portion 28 is tightly closed on the bottom portion 15. As seen in FIGS. 1 and 4, the rim portions 26, 27 of the bottom and cover portions 15, 28 of the box have step-shaped offsets 26.1, 27.1 so that the rim portions 26, 27 adjacent the latch assembly 30 is at a substantially different elevation than the rim portions at the rear of the box, adjacent the hinge assembly 31.

Accordingly, the upper portion 23 of the inclined sidewall portion 17 is closely adjacent the elevated rim portion 26 on the rear wall 21 so that when the cover is opened as to the dotted line position illustrated in FIG. 1, the wafer carrier 11 can be smoothly lifted out manually or by robots without interfering with any portion of the rim 26 of the bottom portion 15 of the box.

Similarly, the upper portion 32 of the inclined bottom panel portion 16 of the bottom portion 15 of the box is closely adjacent the rim 26 adjacent the latch 30 so that when the cover 28 is opened to the position illustrated in FIG. 1, the carrier 11 may be readily lifted out and moved away from the bottom portion 15 either by manual means or by a robot lifting the wafer carrier out of the box bottom portion 15, without interfering with any portion of the box portion.

The wafer carrier 11 has top flanges 33 at each of its sidewalls which are useful for manually lifting the carrier out of the bottom portion 15 of the box; and the carrier 11 may also have a rigid loop or grasping portion 34 illustrated in FIGS. 4 and 13 as to be adapted to be lifted out of the bottom portion 15 by means of a robot arm. Such a robot arm can be slipped into the lifting portion or handle 34 to simply lift the wafer carrier out of the box bottom after the cover has been opened.

The two end walls 35 of the bottom portion 15 of the box have recessed panel portions 36 defining elongate tabs or flange portions 37 which cooperate with the offset panel portion 36 in defining recesses 38 to receive a portion 39 of a robot arm to facilitate lifting of the box when it is in closed condition. Panel portions 36 also confront the side of wafer carrier 11 to confine the wafer carrier against movements. It will be recognized that the offset panels 36, and the recesses 38, are substantially centered in the sidewall 35 as illustrated in FIGS. 1 and 4, so that when the robot arm 39 moves into the recesses 38, and lifts the box, the box will be substantially balanced and maintained in horizontal position, as illustrated, to avoid jostling the wafers W in the carrier.

The latch 30 has a hook-shaped catch 39 which removably attaches to a keeper 40 on the rim portion 27 of the cover. The latch 30 has a flexible body 41 connected to a bight-shaped portion 42 of the body with mounting pins 43 suspended from a mounting tab 44 on the rim portion 26 of the box bottom 15. Upper and lower tabs 45 may be squeezed together to flex the latch body and lift the catch 39 off the keeper; and alternately, a rod-shaped peg 46 may be operated by a robot arm 47, seen in FIG. 1, to lift the catch off the keeper. The latch 30 is more specifically disclosed in the copending application Ser. No. 673,467, filed Mar. 20, 1991 and under common ownership with the present application.

The cover portion 28 of the box includes an inclined confining panel portion 47 which confronts the inclined wafer carrier supporting bottom panel portion 16 so as to retain the wafer carrier 11 on the panel portion 16 without movement. The inclined confining panel portion 47 is oriented at substantially the same angle as the bottom panel portion 16 and is oriented at an acute angle with respect to the horizontally oriented box support panel portions 48 upon which a similar box 10 may rest if the boxes are to be stacked one upon another. The cover 28 also has upstanding nesting ribs 49 to fit into the lower portions of the box bottom adjacent the offset wall portions 36 to minimize movement of one box with respect to another when the boxes are stacked one upon another.

Figure 3:
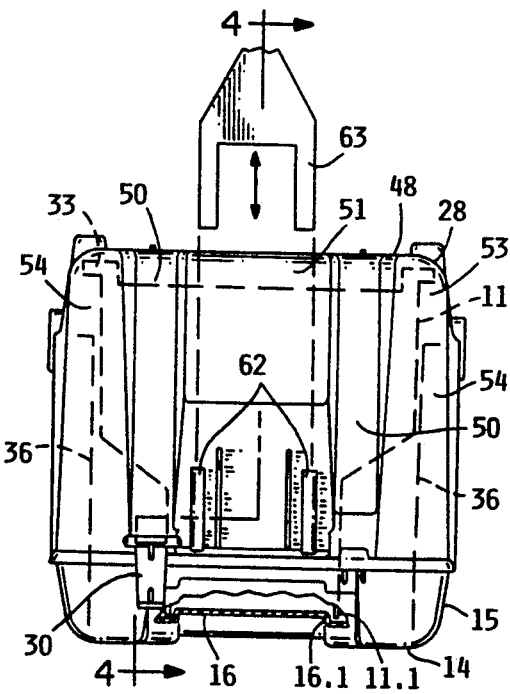
FIG. 3 is a front elevation view thereof, with portions broken away for clarity of detail.

The cover portion 28 also has additional confining panel portions 50, 51 which are disposed in confronting relation to the opposite wafer carrier supporting sidewall panel portion 17 in the bottom portion 15 of the box, and oriented at substantially perpendicular relation to panel portion 47. The confining panel portion 51 is disposed adjacent the centralmost portion of the cover 28 at the front of the box, as illustrated in FIGS. 3 and 4 and confines the robot receiving handle portion 34 of the carrier to engage this handle portion 34 and minimize movement of the wafer carrier in the box. The confining panel portions 50 are disposed at opposite sides of the central panel portion 51 and closely confront the adjacent end wall 52 of the wafer carrier 11.

In addition to the wafer carrier confining panel portions 50, 51, the front wall 53 of the cover also includes panel portions 54 which are formed integrally with sidewall panel portions 28.1 of the cover 28. The sidewall portions 28.1 of the cover 28 are formed integrally with the rim portions 27 which closely interfit with the rim portions 26 of the bottom portion of the box.

The hinge assembly 31 is illustrated in detail in FIGS. 9–12.

As best seen in FIG. 2, there are two such hinge assemblies 31, symmetrically arranged adjacent the back wall 21 of the box bottom portion 15 to accommodate swinging of the cover portion 28 to open position.

Each of the hinge assemblies 31 includes a pair of rigid and stationary socket portions 55 rigidly affixed to and formed integrally with the bottom portion 15 of the box and more specifically with the rear wall 21 thereof. Each of the socket portions 55 has two separate rounded cavity portions 56, 57; and each of the socket portions 55 has two separate elongate access slots 58, 59 opening into the respective rounded socket cavities 56, 57. It will be seen that the elongate access slots 58 have the width of the entire diameter of the rounded cavity 56; and that the access slots 59 have a width which is considerably less than the diameter of the rounded cavities 57, and furthermore, the elongate access slots 59 are asymmetrically arranged relative to the center axis of the rounded cavities 57. The access slots 59 extend parallel to the diameter of the rounded cavity 57, but offset from the center of the rounded cavity 57; and the slots also extend at acute angles with respect to radii of the rounded cavity 57.

Each of the hinge assemblies 31 also includes a pair of insert portions 60, 61 which are affixed to the bottom portion 15 of the box adjacent the rear wall 21 and rim portion 26. The insert portions 60, 61 are respectively received into the rounded cavity portions 56, 57. The insert portion 60 is cylindrically shaped to substantially fill the entire cavity portion 56 and to provide bearing support for the cover portion 28 as it is swung from closed to open position as illustrated in FIG. 1. The insert portion 60 may be lifted out of the cavity portion 56 whenever the insert portion 61 may be released from its cavity portion 57.

Figure 11:
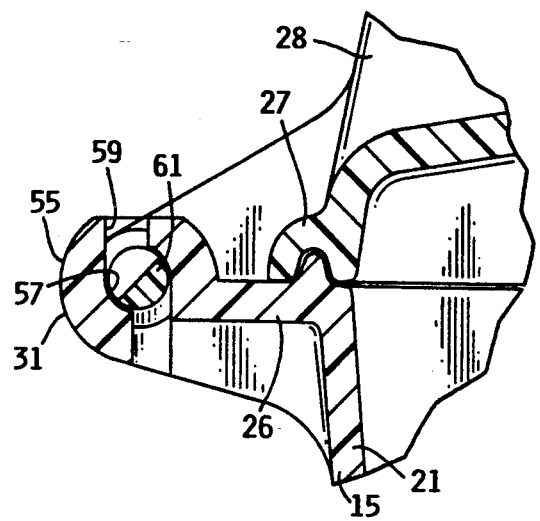
FIG. 11 is an enlarged detail section view taken approximately at 11—11 in FIG. 9.
Figure 12:
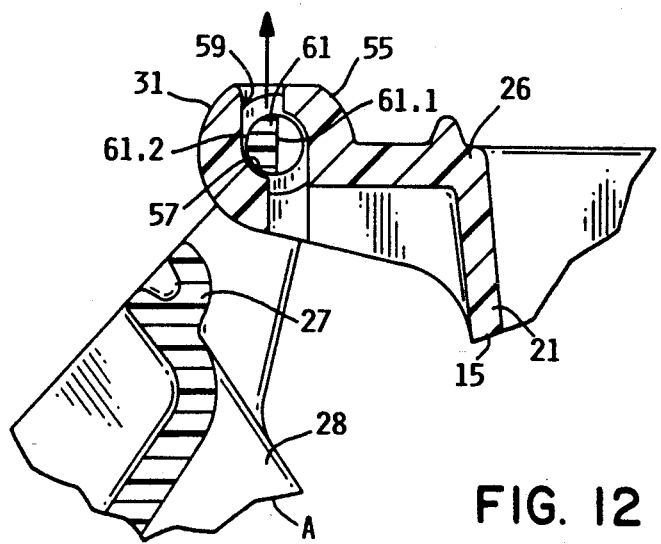
FIG. 12 is an enlarged detail section view like FIG. 11, but showing the cover in open, alternate position.

The insert portion 61 is substantially semicircular in shape as illustrated in FIGS. 11 and 12 and has one flat side 61.1 and one rounded side 61.2 conforming to the rounded configuration of the cavity portion 57, as to have a width slightly less than the width of the access slot 59 so that when the insert portion 61 has the proper orientation in the cavity 57, it may be lifted out through the slot.

The orientation of the semicircular insert portions 61 relative to the cover portion 28 is to be particularly noted. The configuration of the insert portion together with the shape and location of the access slot 59 will prevent the hinge assembly from being disassembled; i.e., the insert portion 61 is prevented from being lifted out of cavity 57 when the cover is closed as illustrated in FIG. 11. When the cover portion 28 has been inverted into the dotted line position indicated by letter P and illustrated in FIG. 1, the insert portion 61 continues to be obstructed from being removed through the slot 59 because in this open position or inverted position of the cover 28, the insert portion 61 has not yet aligned with the access slot 59.

However, when the cover has been allowed to swing slightly further, to the alternate position indicated by dotted lines and the letter A in FIG. 1, and indicated by the position of the cover 28 and the letter A in FIG. 12, the insert portion 61 aligns directly with the access slot 59, thus permitting the insert portion 61 to be lifted out of the socket portion 55, thus removing the cover portion 28 from the bottom portion 15 at the box.

Accordingly, therefore, in the ordinary use of the box for transporting or storing wafer carriers 11, the box may be opened by inverting the cover to the dotted line position illustrated in FIG. 1, so as to rest upon the same surface which supports the box bottom portion 15, and thereby accommodate loading and unloading a wafer carrier into the box.

However, when the box has been used, it may be desired to thoroughly clean the box, the cover may be lowered to alternate position A and be removed and thereafter put into a cleansing bath or cleaning machine to prepare the box and its cover for the next cycle of use.

It is to be particularly noted in the use of the box 10, that when the cover has been swung to open position, the wafer carrier 11 may be readily picked up either manually or by a robot and simply lifted smoothly out of the box bottom without likelihood of there being interference between the wafer carrier and any portion of the box bottom or the rim portion 26. It should be recognized that after the latch 30 has released the cover, the latch will swing downwardly about the pivots 43 until the bight portion 42 bears against the adjacent portion of the box bottom so that the catch 39 is swung far out of the way.

When the wafer carrier is to be replaced into the box again, the wafer carrier 11 will smoothly fit onto the inclined panel portions 16 and 17, being guided by the offsets 16.1, 17.1 so that the wafers are maintained in inclined position, substantially as illustrated in FIG. 4 so that all of the wafers in the carrier will lean against one of the sets of ribs 13 and thereby be prevented from being jostled as the box may be moved during transport or storage.

The front portion of the cover 28 includes a pair of flanges 62 to receive a robot arm 63 which may be used for manipulating the cover portion 28 during its opening and closing.

The form of container illustrated in FIGS. 14–17 is indicated in general by numeral 70 and again, includes a bottom portion 71 and a top portion 72 connected to each other by a two-part hinge assembly 73 and latched by a latch mechanism 74. The cover portion 72 and bottom portion 71 fit together at interfitting rim portions 75 and 76. The bottom portion 71 of the container has recesses 77 in its end walls 77.1 to receive robot arms for lifting and carrying the box.

Figure 15:
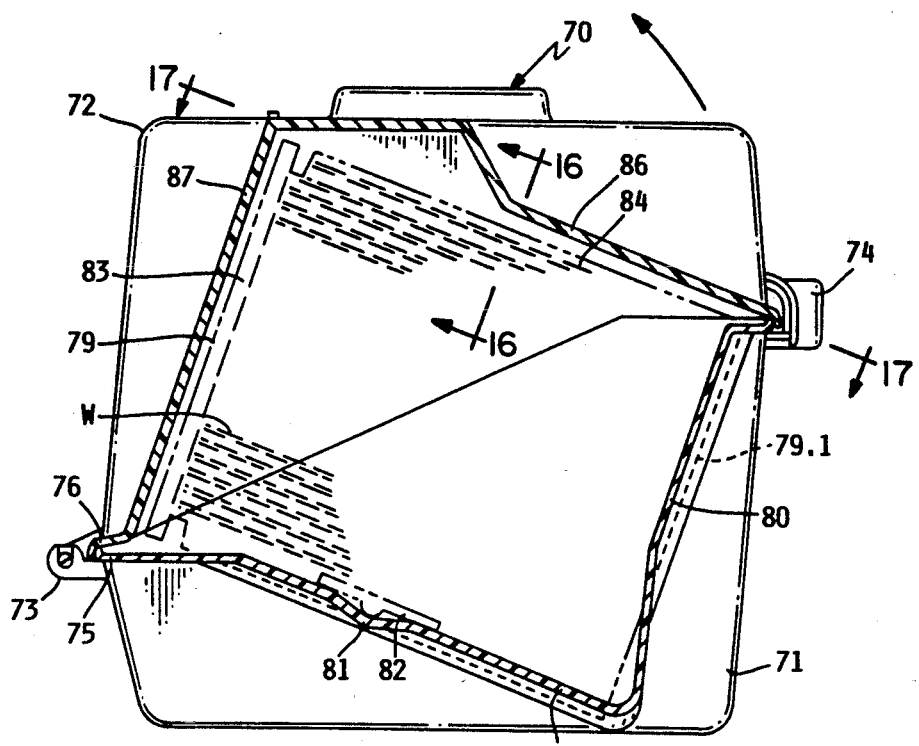
FIG. 15 is a detail section view of the container illustrated in FIG. 14.

As illustrated in FIG. 15, the box bottom portion 71 has an inclined bottom panel portion 78 for supporting a wafer carrier 79 in inclined position, and the bottom portion 71 of the box also has a second inclined panel portion 80 also supporting a portion of the wafer carrier in inclined position. In this box 70, the bottom panel portion 78 is uniquely configured and has a recess at 81 to receive the H-bar end wall of the carrier 79, and it will be seen that in this version, the wafers W lie in inclined position, but substantially parallel with the bottom support panel portion 78. The feet or bottom 79.1 of the wafer carrier 79 lie against the inclined sidewall panel portion 80 and are confined by offsets 80.1 against sidewards movement.

The open top of the wafer carrier 79, and its top flanges 83 are adjacent the hinge assembly 73 of the box portion; and the front end wall 84 of the carrier, together with the robot flanges 85 (see FIG. 16) which permit the wafer carrier to be handled by a robot are disposed adjacent a confining panel 86 which is a part of the cover portion 72. The panel portion 86 also has an offset portion 86.1 to accommodate and confine a robot handle of the type illustrated at 34 in FIG. 13, if the wafer carrier has such a feature. The cover 72 also includes a second inclined confining panel portion 87 which confronts the top flanges of the wafer carrier and prevents the wafers therein from accidentally moving out of the wafer carrier during handling or shipment.

It should be noted in FIG. 14, that the cover 72 will swing to open position into the dotted line position indicated by the letter O in FIG. 14; but by simply rearranging the latch portion and the hinge assembly in the molds for the carrier, the cover portion can be arranged to swing in the opposite direction as indicated by the letter N in FIG. 14. Again, the carrier 79 illustrated in dotted lines in FIG. 15, is similar to the carrier illustrated in U.S. Pat. No. 4,949,848 or other similar carriers which are well-known to persons of skill in the art.

Figure 17:
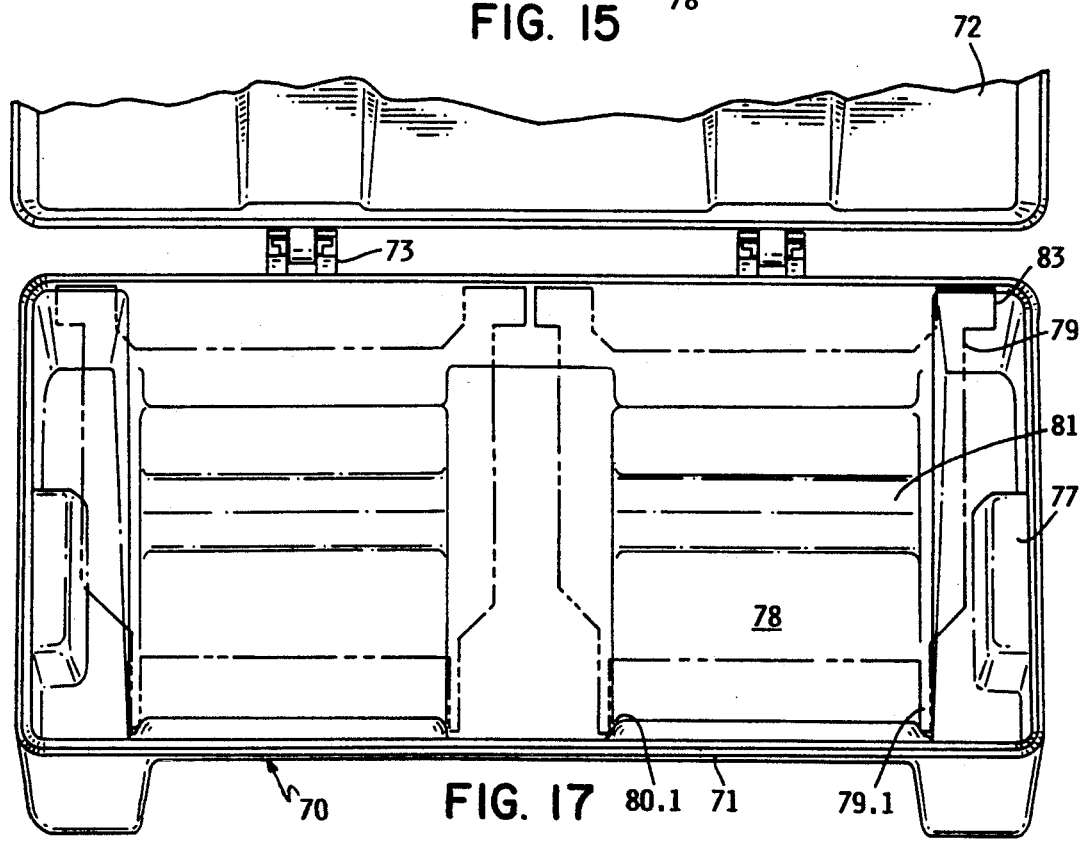
FIG. 17 is a detail plan view of the box in open position and having portions of the cover broken away.

The container 70 of FIGS. 14–17 is elongate in shape as illustrated in FIG. 17 as to accommodate two wafer carriers in side-by-side relation in the box bottom, and enclosed by the cover portion 72.

In this version of the container 70, like the container 10, the wafer carrier is oriented in inclined position so that the wafers are all inclined and rest upon one set of the ribs 86 in the wafer carrier.

The wafer carrier may be readily lifted out of the box bottom when the cover has been opened, by either manual means or by a robot. If the wafer carrier is to be lifted out of the box by a robot, the robot will engage the attachment flanges 85 adjacent the end wall 84 of the wafer carrier and the wafer carrier may be lifted smoothly out of the box bottom without interference by any portion of the peripheral rim of the box bottom or cover. Similarly, if the wafer carrier is to be lifted manually out of the box bottom 71, the wafer carrier may be picked up by a person with both hands, lifting upon the flanges 79 at the top portions of the wafer carrier. Again, the wafer carrier will be lifted smoothly out of the box bottom without interfering with any portion of the box bottom. Alternately, it may be desirable in some circumstances to attach the hinge to obtain the swinging of the cover to the position P illustrated in FIG. 14, and again, the wafer carrier may be readily handled either manually or by robot.

It will be seen that I have provided new and improved containers for storage and transport of wafers and wafer carriers to safely store the wafers against damage by maintaining the wafer carriers and the wafers therein in inclined position and by confining the wafer carriers and wafers with inclined panels so as to minimize any possible movement of the wafers in the wafer carrier while they are stored in the container. The wafer carriers may be readily and easily loaded into the box and smoothly and easily lifted out without likelihood of interference or damage to the wafers.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. A wafer storing and transporting container to be supported on a horizontal surface, comprising:

a wafer carrier comprising a lower foot portion, an end wall portion and sidewall portions with individual wafer storing compartments, said wafer storing compartments being elongate and extending substantially parallel to the end wall portion, said lower foot portion and said end wall portion being oriented at approximately a right angle with respect to each other, and a box enclosing said wafer carrier and comprising a bottom portion and a cover portion interfitting with one another and also comprising a bottom panel portion and a sidewall panel portion adjoining the bottom panel portion and oriented at approximately a right angle with respect to said bottom panel portion, one of said panel portions being uniquely shaped to interfit with one of said portions of the wafer carrier, the bottom portion of the box having a supporting portion to lie horizontally upon such a horizontal surface, said bottom panel portion being inclined with respect to the horizontally lying said supporting portion whereby to be inclined from the horizontal and whereby said sidewall panel portion is inclined from the vertical, said panel portions of the box supporting the lower foot portion and the end wall portion of the wafer carrier in inclined position relative to the horizontally lying said supporting portion to maintain the elongate wafer storing compartments of the wafer carrier in inclined position.

2. A container according to claim 1 wherein the end wall portion of the carrier is H-shaped, and wherein one of said panel portions of the box is configured to correspondingly fit with the H-shaped end wall portion of the carrier.

3. A container according to claim 2 wherein said sidewall panel portion of the box comprises a recess configured to receive said H-shaped end wall portion.

4. A container according to claim 2 wherein the bottom panel portion of the box comprises a recess configured to receive said H-shaped end wall portion.

5. A container according to claim 1 wherein the wafer carrier has protruding and spaced supporting feet in said lower foot portion, and wherein one of said panel portions of the box has offsets confining said supporting feet against movement across the panel.

6. A container according to claim 1 wherein both of said panel portions are on the bottom portion of the box.

7. A container according to claim 6 wherein the box also comprises confining panel portions on the cover portion and opposite to the inclined bottom panel portion and to the inclined sidewall panel portion, each of the confining panel portions being inclined like the panel portion to which it is opposite.

8. A container according to claim 1 wherein the cover portion is hinged to the bottom portion to facilitate swinging the cover to open position; the bottom portion comprises rim portions adjacent to said panel portions to permit the wafer carrier to be moved along the panel portions and away from the bottom portion of the box when the cover portion has been swung to open position.

9. A container according to claim 8 wherein each of the inclined panel portions has upper and lower portions, the rim portions being adjacent the upper portion of each inclined panel portion.

10. A container according to claim 1 wherein the bottom portion of the box comprises wall portions with flange portions in spaced and confronting relation therewith and defining recess portions to receive a robot arm.

11. A container for storing and transporting a wafer carrier, comprising a box comprising a bottom portion and a cover portion interfitting with the bottom portion in closed position and capable of swinging progressively first into an inverted open position and then into an alternate position, and a two-part demountable hinge assembly interconnecting the bottom and cover portions and accommodating said swinging, the hinge assembly comprising an insert portion and a socket portion assembled with each other and rotatable with respect to each other at and between said closed and open positions of the cover portion, the insert portion having a width relative to the socket portion to freely rotate therein, said pocket portion comprising a retaining portion retaining said insert portion against removal from the socket portion when the bottom and cover portions are in closed and open positions, and said socket portion comprising an access slot having a width freely receiving the insert portion therethrough without restriction when the bottom and cover portions are in said alternate position, whereby said insert and socket portions being released for separation upon rotation and swinging of the cover portion to said alternate position.

12. A container according to claim 11 to be placed upon a supporting surface and wherein, in said inverted open position, the cover portion engages such a supporting surface, and in said alternate position, the cover portion is swung below the supporting surface while the bottom portion of the box is in position to rest upon such a surface.

13. A container for storing and transporting a wafer carrier, comprising a box comprising a bottom portion and a cover portion interfitting with the bottom portion in closed position and capable of swinging first into an inverted open position and then into an alternate position, and a two-part demountable hinge assembly interconnecting the bottom and cover portions and accommodating said swinging, the hinge assembly comprising an insert portion and a socket portion assembled with each other and rotatable with respect to each other at and between said closed and open positions of the cover portion, the socket portion comprising a rounded socket cavity confining the insert portion, the socket portion also comprising an access slot into the socket cavity, the access slot being asymmetrically arranged relative to the center axis of the socket cavity, the insert portion having a size coordinated with the size of the access slot to pass therethrough, said insert and socket portions being released for separating upon rotation and swinging of the cover portion to said alternate position.

14. A container for a wafer carrier according to claim 12 wherein the access slot is oriented parallel to a tangent of the rounded socket cavity.

15. A container for storing and transporting a wafer carrier, comprising a box comprising a bottom portion and a cover portion interfitting with the bottom portion in closed position and capable of swinging first to an inverted open position and then into an alternate position, and a two-part demountable hinge assembly interconnecting the bottom and cover portions and accommodating said swinging, the hinge assembly comprising an insert portion and a socket portion assembled with each other and rotatable with respect to each other at and between said closed and open positions of the cover portion, the socket portion comprising a rounded socket cavity confining the insert portion, the socket portion also comprising an elongate access slot into the socket cavity and oriented parallel and offset from a diameter of the socket cavity, the inert portion having a size coordinated with the size of the access slot to pass therethrough, and said insert and socket portions being released for separation upon rotation and swinging of the cover portion to said alternate position.

16. A container for a wafer carrier according to claim 15 wherein the insert portion comprises a flattened side and a rounded side corresponding to the shape of the socket cavity.

* * * * *